United States Patent [19]

Fowler

[11] 3,760,090

[45] Sept. 18, 1973

[54] ELECTRONIC CIRCUIT PACKAGE AND METHOD FOR MAKING SAME

[75] Inventor: William Lee Fowler, Fox Point, Wis.

[73] Assignee: Globe-Union Inc., Milwaukee, Wis.

[22] Filed: Aug. 19, 1971

[21] Appl. No.: 173,145

[52] U.S. Cl. ............ 174/52 S, 29/626, 174/DIG. 3, 317/101 CP, 317/101 CM, 312/234 G

[51] Int. Cl. ............................................. H05k 5/00

[58] Field of Search...................... 174/DIG. 3, 52 S, 174/50.5, 50.6; 317/234 G, 101 A, 101 CP, 101 CM, 50.64; 29/626

[56] References Cited

UNITED STATES PATENTS 3,349,481 10/1967 Karp ...................... 174/DIG. 3 UR 3,601,522 8/1971 Lynch ...................... 174/DIG. 3 XR

*Primary Examiner*—Darrell L. Clay

*Attorney*—Albert H. Pendleton et al.

[57] ABSTRACT

A multilayered electronic circuit package is disclosed containing a cavity for the mounting of one or more electronic devices such as semiconductor chips. A metallized lead pattern at the interface of two adjacent layers of the body extends from the top surface portion of the underlying layer within the cavity to the overhanging underlying surface portion of the overlying layer of the body. Bonding wires from the electronic device may be attached to the inner ends of these metallized leads, and external leads may be attached to the exterior ends of these metallized leads.

11 Claims, 8 Drawing Figures

Inventor
William L. Fowler
by: Pendleton, Neuman, Williams & Anderson
Atty's

PATENTED SEP 18 1973 3,760,090

SHEET 2 OF 2

Inventor
William L. Fowler
by: Pendleton, Neuman, Williams & Anderson
Att'ys

ELECTRONIC CIRCUIT PACKAGE AND METHOD FOR MAKING SAME

BACKGROUND OF THE INVENTION

This invention relates to an electronic circuit package of the type which is used for enclosing or encapsulating one or more electronic devices for an integrated or a hybrid circuit.

While the invention will be described in connection with a standardized flat pack or dual in-line package for an integrated circuit, it will be understood that it will have other applications including use in connection with a package for a hybrid circuit encapsulation. Also, while the invention will be herein described in connection with a ceramic package, it will be understood that it will have application to other materials such as, for example, plastics or glass which have in the past also been used as materials for electronic circuit packages.

Electronic circuit packages are adapted to enclose and hermetically seal an electronic device such as a semi-conductor chip so that the operating characteristics of the device will not be affected by changes in atmospheric pressure or by airborne contaminants. This type of package must be constructed to maintain its hermeticity under adverse storage and operating temperatures and under conditions of shock and vibration such as might be experienced in the handling of the package or of the electronic unit of which the package forms a part. Such packages have a central cavity in which is mounted the semiconductor chip, and leads are brought in through the sidewalls of the package for connection with the chip.

The package is usually formed of several layers, and the leads are brought in between the layers to the central cavity. It was found that if flexible metal leads were used and these extended between the layers of the package as in the case of glass seal packages, it was difficult to obtain a reliable hermetic seal at the interface of the layers, particularly if there were a number of these leads, or if the leads were in any way subjected to mistreatment.

The matter of obtaining a hermetic seal between the layers was substantially improved with the development of metallized leads formed or painted on a substrate and resulted in the standard three layered ceramic structure presently in wide use in the electronics industry. This package consists of a ceramic base layer with a metallized chip attach pad on its top surface; a centrally apertured middle ceramic layer having on its top surface a metallized lead pattern, including wire bond attachment pads adjacent the central aperture for attachment of wire bonding leads from the semiconductor chip and braze pads at the periphery for attachment of exterior leads; and finally a top layer with a central aperture somewhat larger than the aperture in the middle layer and having on its top surface a metallized seal frame or ring surrounding this aperture to permit the application of a cover for closing the cavity.

The electronics industry has established certain standard exterior dimensions for the electronic circuit packages such as spacing between the leads and between the lead rows in the case of a standard dual in-line package. In recent years the chips have become larger, requiring a larger chip cavity, and cutting to a minimum the area of the wire bond attachment pad which is required for the attachment of chip wire bonding leads and the area for the braze pads which is required for the attachment of the exterior leads. However, an increase in the size of chip is usually accompanied by an increase in the number of metallized leads required. Moreover, for hermeticity, the "seal path," i.e., the distance between the wire bond attachment pad and the exterior of the package, must be maintained at above a minimum dimension to provide a proper seal. In the standard package this minimum dimension is the width of material between the aperture and exterior side of the top layer, and this dimension in turn also affects the width of the metallized seal frame (for securing the cover) and the fragility of the top layer. With the standard package it is, therefore, very difficult to provide a larger chip cavity without excessively narrowing the wire bond attachment pad area, or the braze pad area, or the seal path and metallizing ring.

Various attempts have been made to redesign the package in order to obtain a larger chip cavity. One proposal has been to eliminate the braze pad area or shelf on the top surface of the middle layer and place this on the bottom surface of the base layer of the package. A conducting trace must then be metallized on the aligned exterior edges of the middle and bottom layers of the package. With this design the exterior leads would then be brazed to the bottom of the package. This, however, has certain disadvantages including a greater shorting potential, a greater criticality in handling due to the placement of the leads at the bottom of the package, and an increase in the cost of manufacturing as a result of the additional edge metallizing step.

The present invention enables the chip cavity of the electronic package to be increased substantially while maintaining or even increasing the width of both the wire bond attachment pad area and the braze pad area. This combination of the larger wire bond attachment pad area and the chip cavity gives a larger entry angle necessary for the entry of the bonding head for bonding the chip wire leads to the wire bond attachment pad. There is no interlayer metallized trace or interconnection required for the exterior leads, and there are no connections or metallizing on the bottom package.

SUMMARY OF THE INVENTION

The invention is an improvement in an electronic circuit package of the type used to enclose and hermetically seal a semiconductor chip. In accordance with one form of the invention, the package has a multilayered body containing a cavity for mounting the chip, the layers of the body being formed of an electrically nonconductive material. The body includes a first layer having a chip lead connecting surface portion adjacent the cavity and a second overlying said first layer and having a peripheral overhand portion extending outwardly from the corresponding peripheral portions of the first layer. An electrically conductive means, preferably in the form of a metallized lead pattern, is disposed at the interface of said layers and extends from the chip lead connecting surface portion of the first layer to the overhang portion of the second layer. Lead wires from the chip may be connected to the interior ends of the electrically conductive means on the chip lead connecting surface portion of the first layer adjacent cavity, and exterior leads may be connected to the exterior ends of the electrically conductive means on the overhang portion of the overlying or second layer.

While the body may be a two layer structure, it is preferred that it be a three layer structure with the top and intermediate layers being apertured and a chip-supporting layer underlying the intermediate layer to form the bottom of the cavity. In this three layer structure the intermediate layer is the aforementioned "first" layer having the chip lead connecting surface portion,and the "second" layer is the top layer having the peripheral overhang portion.

The preferred method for forming the multilayered electronic circuit package body includes the steps of forming a first portion of said electrically conductive means on the top surface of the "first" layer (i.e., the intermediate layer in a three layered structure), forming a second portion of said electrically conductive means on the bottom surface of the "second" or overlying layer, assembling the layers with the first and second electrically conductive portions in substantial overlapping registry, and heating the assembly to fuse the portions of the conductive means together.

The fusion of the portions of the electrically conductive means may be conducted simultaneously with the firing of the ceramic. It is preferred that prior to the firing step the assembly be subjected to sufficient heat and pressure to effect conformance of the ceramic over the metallized layers to form intimate contact and a green bond so that after firing, a completely monolithic structure will be produced.

DESCRIPTION OF THE PREFERRED EMBODIMENTS

Figures 1, 2:
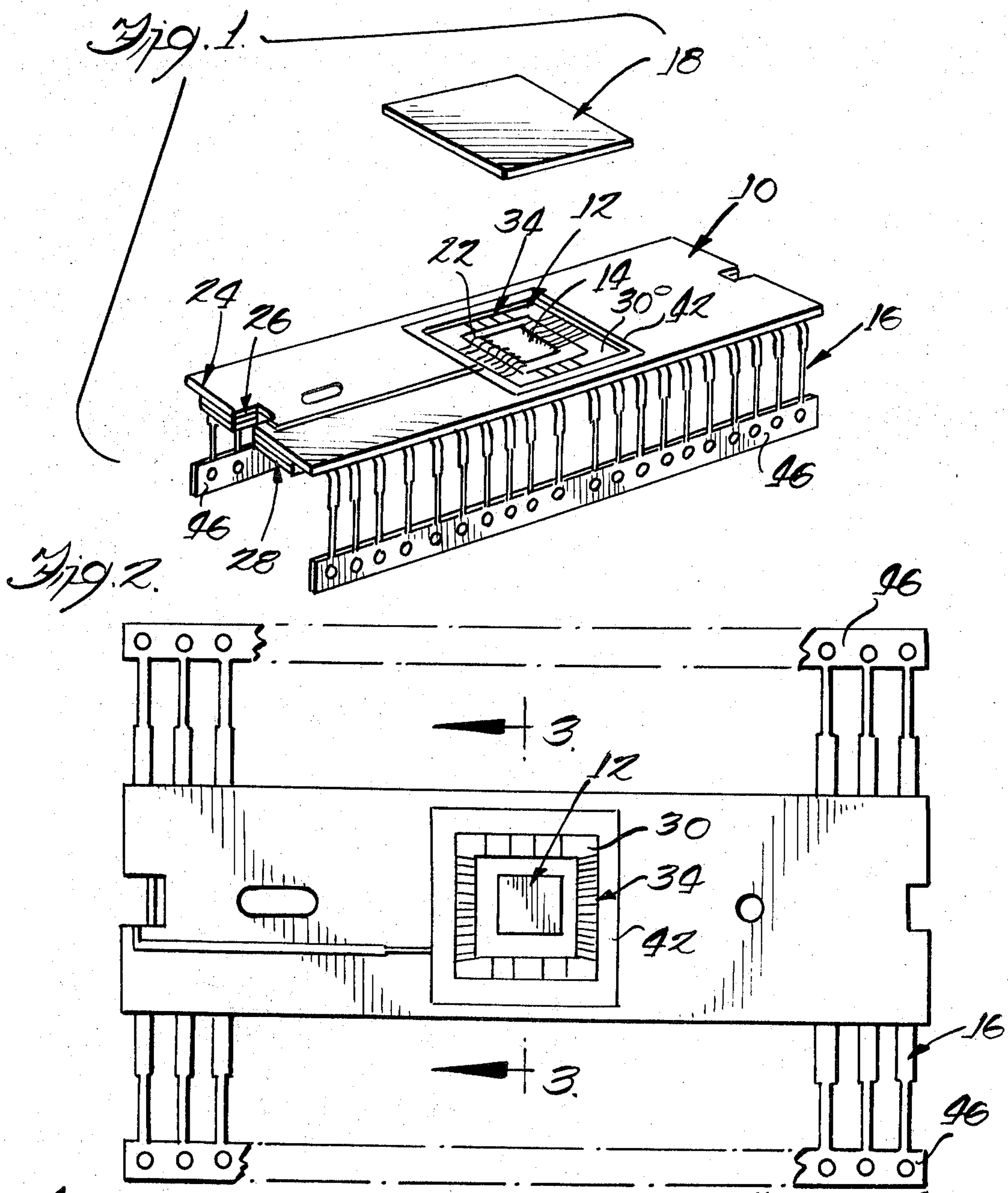
FIG. 1 is a perspective view of an electronic circuit package and cover, the package having been constructed in accordance with this invention and the cover having been raised to show the interior thereof including a semiconductor chip mounted within the cavity.
FIG. 2 is a top plan view of a package constructed in accordance with this invention.

In FIG. 1 there is disclosed an electronic circuit package 10 having a cavity 12 within which may be mounted an electronic device such as a semiconductor chip 14. The package has a plurality of exterior leads 16, and the chip cavity 12 is adapted to be closed by means of a cover 18. Packages of this type may be used to encapsulate metal-oxide-silicon (MOS) chips and bipolar chips as well as chips for medium scale and large scale (MSI/LSI) integrated circuits. The package may also be used in the fabrication of hybrid circuits.

The particular electronic circuit package illustrated is a dual in-line package with all of the exterior leads 16 being arranged in two parallel lines or rows along the longitudinal edges of the package. It will be appreciated that the invention may be embodied in other package configurations, such as, for example, packages with the exterior leads extending from the end edges, or all edges, as well as packages of various other polygonal or even round configurations. When the chip 14 is mounted in place within the cavity 12 and the chip leads or wires 22 are attached, the cover 18 may be secured in position to seal the chip cavity, so that the chip will be encapsulated and hermetically sealed within the cavity. This will prevent the electronic circuit from being adversely affected by changes in atmospheric pressure or by airborne contaminants, and it insures the reliability of the circuit.

The electronic circuit package 10 is basically formed of a material which is an electrical insulator and preferably one having a high thermal dissipation. Although material such as glass or plastic may be used, it is preferred that the material be a ceramic such as, for example, an alumina ceramic or a beryllia ceramic. The body of the package is formed of a plurality of layers. In the illustrated embodiment there are three such layers, a top layer 24, an intermediate layer 26 and a bottom layer 28. The intermediate layer 26 may herein be termed the "first" layer; the top layer 24 may herein be termed the "second" layer; and the bottom layer 28 may herein be termed the "third" layer. These layers are laminated together, and in the case of ceramic, they are fired to produce a unitary monolithic structure. The layers are elongated strips and may be on the order of 2 inches in length, 0.550 inch or less in width and 0.020 inch in thickness.

The package illustrated in FIGS. 1–6 is a single cavity package with the top and intermediate layers 24 and 26 having central apertures 24*a* and 26*a*, respectively, and the bottom layer 28 extending across and forming the bottom of the cavity 12. The aperture 24*a* in the top layer 24 is larger than the aperture 26*a* in the intermediate layer 26, and these apertures are disposed in registry so that the cavity 12 is a stepped cavity, with a shelflike upper surface portion 30 on the intermediate layer 26 immediately adjacent the aperture in that layer being exposed through the aperture 24*a* in the overlying layer 24. This surface portion 30 is disposed within the chip cavity 12 and serves as a chip lead connecting surface or "wire bond shelf" as will be more fully described herein.

Each of the longitudinal edges of the top layer 24 of the package extends laterally outwardly from the corresponding longitudinal edges of the intermediate layer 26, and these peripheral overhang portions 32 are presented for the attachment of the exterior leads 16 in the manner which will be more fully hereinafter described. In other package configurations such as, for example, those with end edge exterior leads, the overhanging portions would extend beyond the end edges of the intermediate layer 26 for the attachment of the exterior leads 16.

An electrically conductive means 34, preferably in the form of a metallized pattern, is disposed at the interface of the top and intermediate layers 24 and 26 and extends from the chip lead connecting surface portion or wire bond shelf 30 of the intermediate layer 26 to the overhang portions 32 of the top layer 24. In fact, the electrically conductive means 34 extends at least partially across the chip lead connecting top surface portion 30 and the bottom surface of the overhang portions 32. The connecting wires 22 from the chip 14 are adapted to be connected to the inner ends of the electrically conductive means 34 on the chip lead connecting surface 30, and the exterior leads 16 are adapted to be connected to the exterior portions of the electrically conductive means 34 on the undersurface of the two parallel longitudinally-extending overhang portions 32.

Figure 3:
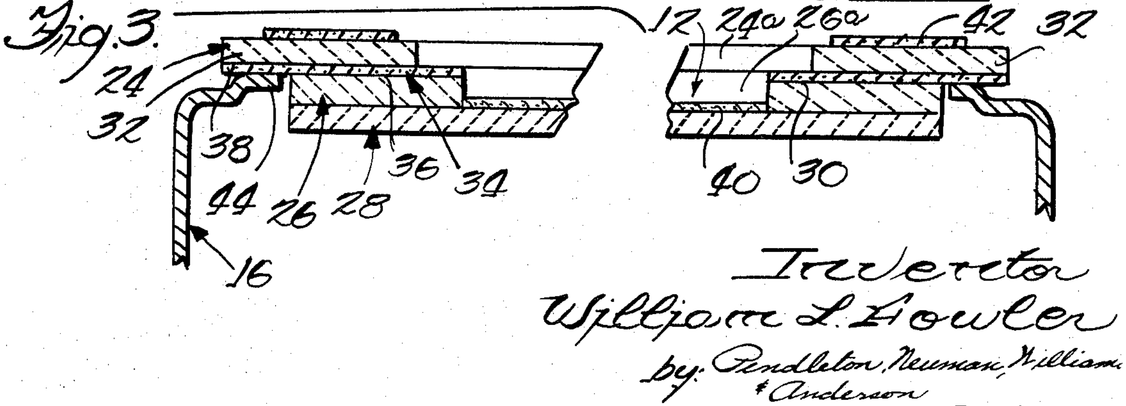
FIG. 3 is an enlarged sectional elevational view taken substantially along line 3—3 of FIG. 2, but illustrating the external leads bent in a manner similar to that illustrated in FIG. 1.
Figure 4:
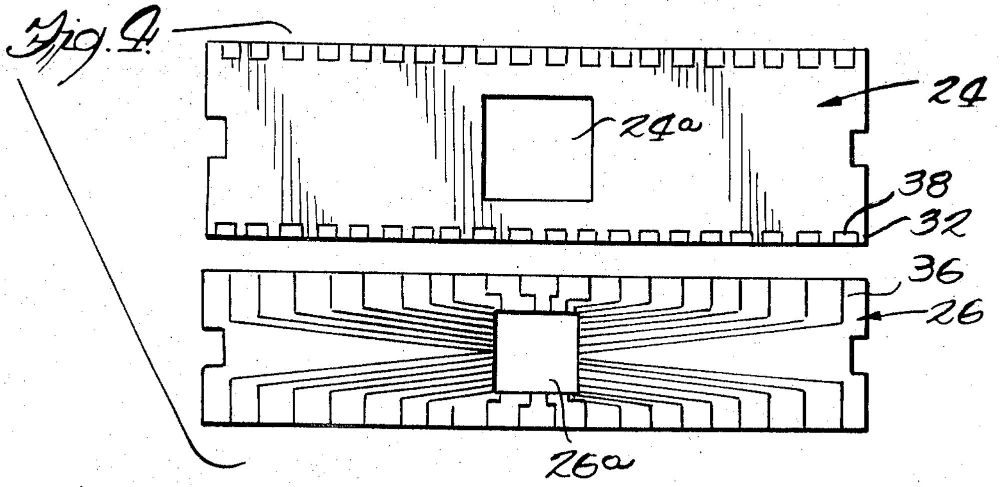
FIG. 4 is a top plan view of the top two layers of a three layer package body showing the bottom surface of the top layer with the metallized braze pads thereon and the top surface of the intermediate layer with the metallized lead pattern thereon.
Figure 5:
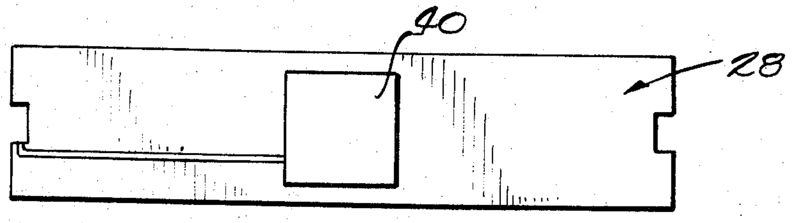
FIG. 5 is a top plan view of the bottom or chip-supporting layer of a three layer package.

The electrically conductive means 34 preferably comprises a combination of the metallized pattern of leads 36 and a plurality of discrete metallized braze pads 38. The lead pattern 36 is preferably screen painted on the top surface of the intermediate layer 26 as best illustrated in FIG. 4. As may be seen this pattern comprises a plurality of metallized leads which extend from adjacent the central aperture 26*a* to the two longitudinal edges of the intermediate layer. The metallized braze pads 38 are preferably screen painted in two parallel rows on the undersurface of the two parallel longitudinal overhang portions 32 adjacent the edges of the top layer 24, also as illustrated in FIG. 4. When the two layers 24 and 26 are assembled, the outer ends of each of the leads 36 will be aligned with and disposed in underlying engagement with a respective one of the braze pads 38 on the underside of the top layer 24. Thus when the assembly is heated to effect fusion of the metallized pattern, each lead 36 and corresponding braze pad 38 will coalesce to form a single discrete unitary part of the electrically conductive means 34 as illustrated in FIG. 3.

On the bottom of the cavity 12 across the top surface of the lower layer 28 is a metallized pad 40 to which the chip 14 is adapted to attached. At the top surface of the top layer 24 is a metallized seal frame 42 to which the cover 18 may be attached to encapsulate the chip 14 within the package 10. The metallized seal frame 42 extends completely around the cavity-defining aperture 24*a* in the top layer and is preferably spaced from the aperture-defining portions of the top layer. This ring is also preferably spaced from the longitudinal edges of the top layer so that there is no chance for any part of the seal frame from flowing down to short against the electrically conductive means 34 during the firing operation.

The pattern of leads 36 and the braze pads 38 which form the electrically conductive means 34, and the metallized pad 40 and the metallized seal ring 42 are, preferably, all screen painted on. The material used for the screen painting may be a powdered tungsten or molybdenum refractory and magnesium silicate, in a vehicle such as butylcarbitolacetate. If desired, a binder such as an acrylic resin or ethyl cellulose may be employed.

One of the features of the invention is the provision of the overhang portion or braze shelf 32 on the top layer 24 of the ceramic structure. This permits the exterior leads 16 to be attached to the electrically conductive means 34 without requiring metallizing across the edges of the layers and without connecting the leads to the bottom of the package. At the same time the overhang permits the package to have a cavity of maximum size.

The leads 16 preferably have a substantially Z-shaped adjacent end portion 44 with the extreme end of each lead being connected to the respective braze pad 38 of the electrically conductive means 34. The Z shape permits the portion of the lead adjacent the end 44 to be spaced downwardly from the brazing area and thus eliminates stress on the leads when they are subsequently bent downwardly. When the leads 16 are first attached, each row of leads is interconnected by a connecting band 46 integral with the leads, preferably stamped from the same highly conductive metal sheet. When the leads are attached they are straight as illustrated in FIG. 2 which facilitates handling, storing and shipping as well as initial assembly. In most instances the connecting bands 46 remain attached to the leads 16 when the package 10 is shipped to the customer. When the customer receives the package he inserts the chip 14, connects the chip leads 22, applies the cover 18 and then bends the exterior leads 16 downwardly as illustrated in FIGS. 1 and 3. At this point the connecting bands 46 may be cut off, and the assembled packaged circuit is ready for connection into the associated circuit.

In the electronics industry the standard dual in-line package having twenty or more leads has an established 0.600 inch spacing between the bend centers of the lead rows, i.e., between the centers of the downwardly depending portions of the leads illustrated in FIG. 3. Also, the distance between the leads in each row, while not necessarily an industry standard, is generally 0.100 inch, and to allow for proper room for the attachment of the chip leads, the chip lead connecting surface or wire bond shelf 30 must have a minimum width of about 0.025 inch. The brazed shelf, which in this instance is the bottom surface of the overhang portion 32, has a minimum width of about 0.040 inch. Also, in order to provide for a proper hermetic seal, it has been found that there must be a minimum of about 0.060 inch between the cavity 12 and the exterior of the package. In addition, it is desirable to have an adequate trace width for the metallized seal frame 42, because this must form a hermetic seal with the cover 18.

Heretofore the electronic circuit packages were constructed with the braze shelf for the connection of the exterior leads 16 and the wire bond shelf for the connection of the chip leads 22 both located on the top surface of the intermediate layer 26. This, however, presented a problem when designing for a larger chip cavity, because the 0.600 inch standardized spacing between bend centers of the rows of leads remained the same. Thus, any increase in cavity size for packages of prior design could be accomplished only by reducing the width (i.e., depth) of the braze shelf or the wire bond shelf or by reducing the distance between the aperture and longitudinal edges of the top layer. Reductions in any of these dimensions, however, cannot usually be tolerated because in most designs the industry established minimum dimensions are being used and further reductions would cause problems in the attachment of the chip leads or the exterior leads or in maintaining sufficient seal path thickness to maintain hermeticity.

By providing the overhang portions 32 on the top layer of the package and metallizing the braze pads 38 on the bottom surface thereof, the size of the chip cavity may be substantially increased while maintaining the established dimension between the two exterior lead rows and maintaining the critical minimum dimensions of the braze shelf, the wire bond shelf and the seal path. More quantitatively, the width of the chip cavity may be increased from a previous maximum of about 0.220 inch to greater than 0.310 inch.

Figure 6:
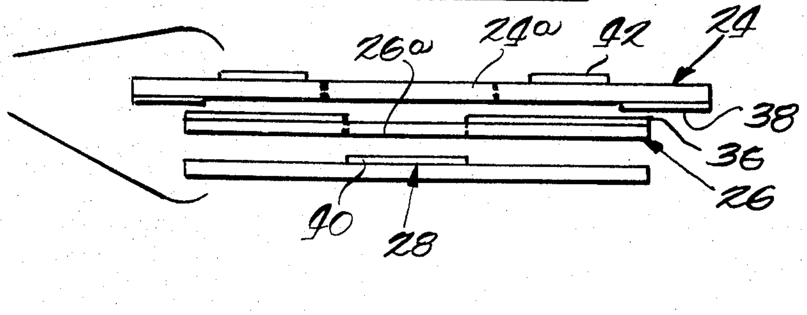
FIG. 6 is an exploded view of the package body showing the layers with the metallized portions in the process of being assembled.
Figure 7:
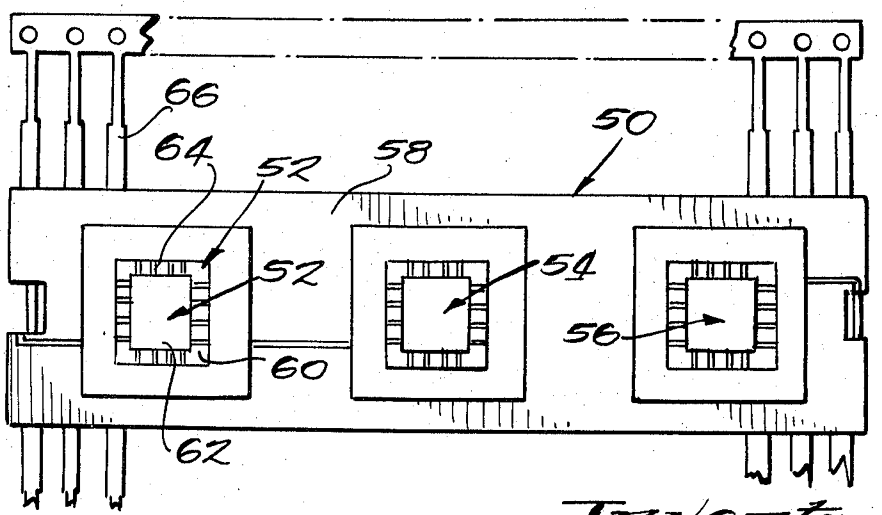
FIG. 7 is a top plan view of an electronic circuit package of slightly modified design.

In FIG. 7 there is illustrated a package 50 of slightly modified design. The only difference between this embodiment and that illustrated in FIGS. 1–6 is that instead of a single central cavity 12, the package 50 has three cavities 52, 54 and 56. The package is a three layer package consisting of a top layer 58, an intermediate layer 60, a bottom layer 62 and an electrically conductive means 64 at the interface of the top and intermediate layers 58 and 60. A cross section taken through any one of the three cavities would be identical to FIG. 3. Exterior leads 66 are connected to the exterior ends of the electrically conductive means 64.

Figure 8:
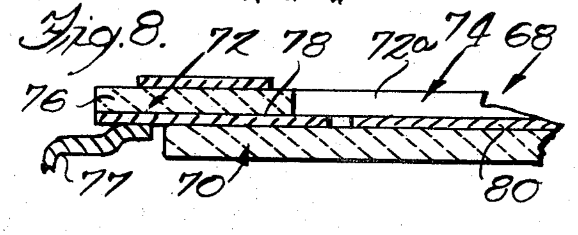
FIG. 8 is an enlarged sectional elevational view of an electronic circuit package of further modified design.

The invention heretofore described, as preferably embodied in a three layer structure, may also be embodied in a two layer structure as best illustrated in FIG. 8. In this cross-sectional illustration the package 68 includes a first or bottom layer 70 and a second or top layer 72. The top layer 72 has an aperture 72*a*, and the bottom layer 70 extends across and forms the bottom of the cavity 74. The edges of the top layer 72 of the package extend laterally outwardly from the corresponding edges of the bottom layer 70, and these peripheral overhang portions 76 are presented for the attachment of the exterior leads 77 in the manner previously described.

A metallized electrically conductive pattern 78 is disposed at the interface of the layers 70 and 72 and extends from the bottom surface of the overhang portions 76 of the top layer 72 to within and partially across the cavity 74 on the top surface of the bottom layer 70. The connecting wires from the semiconductor chip are adapted to be connected to the inner ends of the pattern 78, and the exterior leads 77 are connected to the exterior portions of the pattern 78 on the under surface of the overhang portions 76. Also metallized on the top surface of the bottom layer 70, in inwardly spaced relationship with respect to the conductive pattern 78, is a pad 80 to which the chip is adapted to be attached.

A feature of the invention is the method for forming the electronic circuit package 10. Referring to FIG. 6, this method comprises the steps of forming the metallized pattern 36 of the electrically conductive means on the top surface of the intermediate layer 26; then forming the braze pads 38 of the electrically conductive means on the bottom surface of the top layer 24; assembling the layers 24 and 26 with the portions 36 and 38 of the electrically conductive means 34 in substantial registry and overlapping, and then heating the assembly to fuse the portions of the electrically conductive means together.

Preferably, the overlying layers of the package are formed of a gree (i.e., unfired) ceramic, and the heating of the assembly to fuse the portions of the electrically conductive means 34 may be carried out simultaneously with the firing of the ceramic. The firing may be, for example, in a kiln at a temperture of on the order of about 2,900° F. in a reducing atmosphere of cracked ammonia (essentially $H_2$).

After the green layers are assembled in registry and prior to firing, the assembly may be subjected to a green bonding step which includes applying a sufficient pressure to the assembly to form intimate contact and a green bond between the layers of the unfired ceramic prior to firing. The application of pressure to the structure may be accompanied by the application of a relatively low temperature (as compared to the firing temperature) to aid in obtaining the green bond.

Following the firing step the leads 16 are attached to the peripheral ends, i.e., braze pads 38 of the electrically conductive means 34, and the exposed portions of the electrically conductive means 34 and the attached leads 16 as well as the metallized pad 40 and seal frame 42 are then plated with a noble metal, preferably gold.

A package constructed in accordance with this invention will provide a maximum size cavity in a minimum width of package, and this is done without having to attach leads to the bottom of the package or to extend the metallizing around the edges of the layers.

It is to be understood that the present disclosure has been made only by way of example and that many additional modifications and changes in various details may be resorted to without departing from the invention.

What is claimed is:

1. An electronic circuit package comprising a multilayered nonconductive supporting body containing a cavity for mounting an electronic device, a first layer of said structure having a device lead connecting surface portion, a second layer immediately overlying said first layer and having an aperture aligned with the exposing the immediately underlying device lead connecting surface portion of said first layer and having a peripheral overhang portion extending outwardly from the corresponding peripheral portions of said first layer, and electrically conductive lead pattern means at the interface of said layers and extending from and at least partially across the exposed device lead connecting surface portion of said first layer to and onto the overhang portion of said second layer.

2. The structure of claim 1 and further including exterior lead means connected to said electrically conductive lead pattern means adjacent the exterior ends thereof on said overhanging portion of said second layer.

3. The structure of claim 2 wherein said exterior lead means includes a plurality of exterior leads, each having a substantially Z-shaped inner end portion connected to said electrically conductive lead pattern means on said overhang portion of said second layer, whereby each lead extends downwardly and outwardly away from the point of connection to said electrically conductive means.

4. The structure of claim 1 wherein said layers are ceramic.

5. The structure of claim 1 wherein said body contains a plurality of cavities for mounting electronic devices, said first layer having a device lead connecting surface portion for each of the cavities and said electrically conductive lead pattern means extending from and at least partially across the exposed device lead connecting surface portions of said first layer to and onto the overhang portion of said second layer.

6. A method for forming a multilayered electronic circuit package body at least one overlying layer of which is apertured to define at least in part a cavity within which may be mounted a semiconductor chip and to expose an adjacent interior surface portion of the immediately underlying layer for attachment of chip leads and having an electrically conductive lead pattern means at the interface of the underlying layer and the immediately overlying layer and extending substantially in a single plane from and at least partially across the exposed interior chip lead attachment surface portion adjacent said cavity to and onto an exterior lead attachment surface portion adjacent the periphery of said package body, said method comprising forming a first interior portion of said electrically conductive lead pattern means on the top surface of said underlying layer, forming a second exterior portion of said electrically conductive lead pattern means on the bottom surface of said overlying layer, assembling said layers with the first and second portions of said conductive lead pattern means in substantial registry and in overlapping contact, and heating the assembly to fuse the portions of the conductive lead pattern means together.

7. The method of claim 6 wherein said electrically conductive lead pattern means portions are screen painted with a metal powder disbursed in a vehicle.

8. The method of claim 6 wherein said underlying and overlying layers are formed of a green ceramic, and the heating of the assembly to fuse the portions of the electrically conductive lead pattern means together is carried out simultaneously with the firing of the ceramic.

9. The method of claim 8 and including the further steps of applying sufficient heat and pressure to said assembly to form intimate contact and a green bond between the layers prior to firing.

10. The method of claim 6 and including the further steps of attaching exterior lead frame to the peripheral ends of the electrically conductive lead pattern means and plating the exposed portions of said electrically conductive lead pattern means and lead frames with a noble metal.

11. An electronic circuit package comprising a three layer nonconductive supporting body containing a cavity within which an electronic device is to be mounted, a first layer of said structure having an aperture and having a device lead connecting surface portion adjacent said aperture, a second layer overlying said first layer, said second layer having an overhang portion extending outwardly from the corresponding peripheral portions of said first layer for the connection of exterior leads and having an aperture larger than the aperture of said first layer and aligned therewith to expose the device lead connecting surface portion of said first layer as a shelf within the cavity below the aperture in said second layer, the side walls of the aperture defining portions of said first and second layers defining the side walls of the cavity, a third layer underlying said second layer aperture and forming the bottom of the cavity on which the electronic device is to be mounted, and electrically conductive lead pattern means at the interface of said first and second layers and extending substantially in a single plane from and at least partially across the device lead connecting surface portion of said first layer to and onto the overhang portion of said second layer.

* * * * *

UNITED STATES PATENT OFFICE
CERTIFICATE OF CORRECTION

Patent No. 3,760,090 Dated September 18, 1973

Inventor(s) William Lee Fowler

It is certified that error appears in the above-identified patent and that said Letters Patent are hereby corrected as shown below:

Column 5, line 38, before "attached", insert -- be --

Column 7, line 57, "gree" should be -- green --

Column 8, line 27 (Claim 1), "the" should be -- and --

Column 10, line 1, (Claim 10) "frame" should be --frames--

Signed and sealed this 26th day of March 1974.

(SEAL)
Attest:

EDWARD M.FLETCHER,JR.
Attesting Officer

C. MARSHALL DANN
Commissioner of Patents

168